(12) United States Patent
Paul et al.

(10) Patent No.: US 6,785,170 B2
(45) Date of Patent: Aug. 31, 2004

(54) DATA MEMORY WITH SHORT MEMORY ACCESS TIME

(75) Inventors: Steffen Paul, Baierbrunn (DE); Volker Schöber, Hannover (DE)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 10/181,589

(22) PCT Filed: Jan. 5, 2001

(86) PCT No.: PCT/EP01/00075

§ 371 (c)(1),
(2), (4) Date: Sep. 23, 2002

(87) PCT Pub. No.: WO01/53944

PCT Pub. Date: Jul. 26, 2001

(65) Prior Publication Data

US 2003/0076716 A1 Apr. 24, 2003

(30) Foreign Application Priority Data

Jan. 19, 2000 (DE) .......................... 100 02 139

(51) Int. Cl.[7] .............................................. G11C 7/00
(52) U.S. Cl. ..................................... 365/200; 365/201
(58) Field of Search ................................ 365/200, 201, 365/230.01, 230.03

(56) References Cited

U.S. PATENT DOCUMENTS

| | | | | |
|---|---|---|---|---|
| 5,438,546 A | | 8/1995 | Ishac et al. .................. | 365/200 |
| 5,559,743 A | * | 9/1996 | Pascucci et al. ............. | 365/200 |
| 5,579,265 A | | 11/1996 | Devin ........................... | 365/200 |
| 5,793,683 A | | 8/1998 | Evans .......................... | 365/200 |
| 5,841,710 A | * | 11/1998 | Larsen ......................... | 365/200 |
| 5,841,711 A | | 11/1998 | Watanabe .................... | 365/200 |
| 6,411,558 B1 | * | 6/2002 | Tanaka ........................ | 365/201 |
| 6,639,858 B2 | * | 10/2003 | Kinoshita et al. ........... | 365/200 |

FOREIGN PATENT DOCUMENTS

| | | | |
|---|---|---|---|
| DE | 695 00 007 T2 | 12/1996 | ........... G06F/11/20 |
| EP | 0 554 053 A2 | 8/1993 | ........... G06F/11/20 |
| EP | 0 637 034 A1 | 2/1995 | ........... G11C/11/00 |
| EP | 0 881 571 A1 | 12/1998 | ........... G06F/11/20 |

OTHER PUBLICATIONS

Chen, Tom, *A Self–Testing and Self–Repairing Structure for Ultra–Large Capacity Memories*, IEEE International Test Conference, pp. 623–631, 1992.

Sawada, Kazuhiro et al., *Built–In Self–Repair Circuit for High–Density ASMIC*, IEEE Custom Integrated Circuits Conference,, 1989.

Takeda, Eiji, et al., *VLSI Reliability Challenges: From Device Physics to Wafer Scale Systems*, IEEE, vol. 81, No. 5, pp. 653–673, 1993.

Tanabe, Akira, et al., *A 30–ns 64–Mb DRAM with Built–In Self–Test and Self–Repair Function*, IEEE, vol. 27, No. 11, pp. 1525–1531, 1992.

* cited by examiner

Primary Examiner—Anh Phung
(74) Attorney, Agent, or Firm—F. Chau & Associates, LLC

(57) ABSTRACT

A data memory including a main data memory having a plurality of data memory units, a redundancy data memory that includes a plurality of redundancy data memory units for the replacement of defective data memory units of the main data memory, and a redundancy control logic for controlling the access to the redundancy data memory, the main data memory and the redundancy data memory being connected to a data bus in parallel with one another via data lines, and the main data memory and the redundancy control logic being connected, in parallel with one another, via address lines, to an address bus for the addressing of data memory units in the data memory.

14 Claims, 5 Drawing Sheets

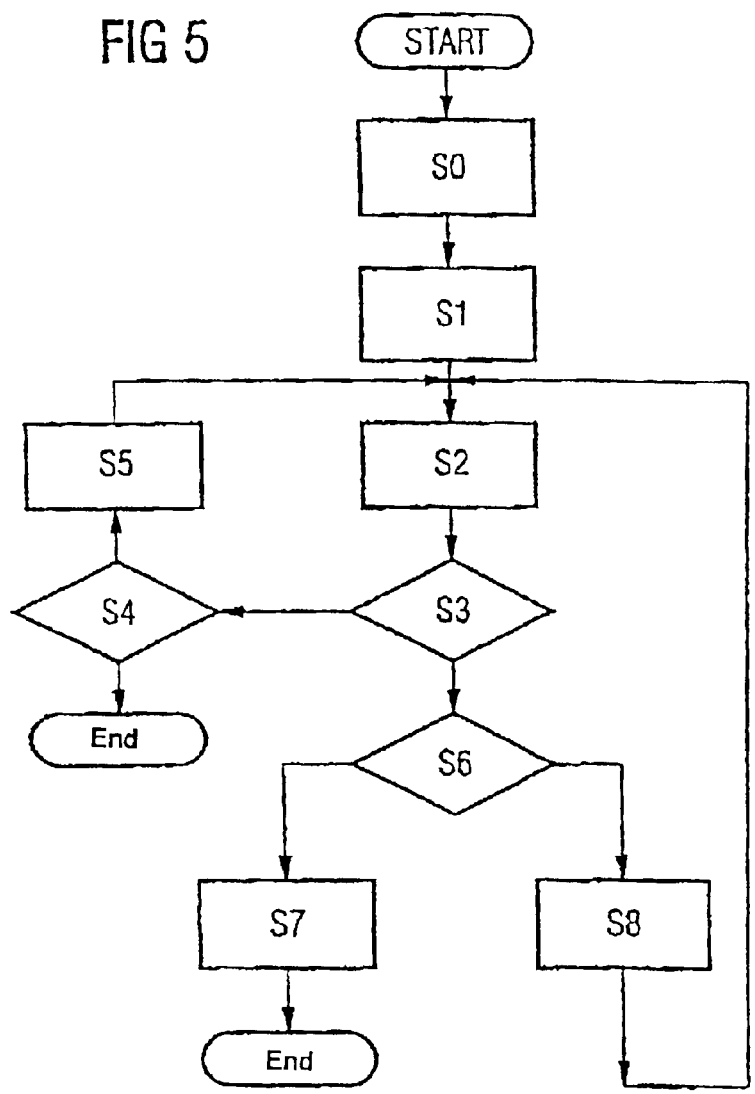

DATA MEMORY WITH SHORT MEMORY ACCESS TIME

TECHNICAL FIELD OF THE INVENTION

The invention relates to a data memory with a short access time, which has a main data memory and a redundancy data memory for the replacement of defective data memory units of the main data memory.

BACKGROUND

The size of data memories and the integration level of data memories are increasing more and more on account of the increased requirements particularly in the case of customized ASIC circuits. On account of the high integration level required and the large memory sizes required, in the course of the complex fabrication process, defective data memory units are also produced here and there in addition to the functioning data memory units. In order to find such defective memory cells, data memories, after they have been fabricated, are subjected to a memory test in which test data patterns are applied to the memory and then a check is made to determine whether the data read out correspond to an expected test data read-out pattern.

In order to prevent a few failed data memory units from rendering the entire data memory fabricated nonfunctional, increasingly redundant memory areas are additionally being provided in data memories, which memory areas serve for the replacement of defective data memory units. For this purpose, in a data memory organized in rows and columns, replacement memory rows and replacement memory columns are additionally incorporated on the data memory chip.

FIG. 1 diagrammatically shows the construction of a data memory with a redundant memory area according memory test, the test data pattern read out is firstly stored and the addresses of the defective data memory units of the data memory are determined by comparison with expected test output patterns. The defective addresses determined are programmed into the redundancy logic, so that, in the event of access to the address of a defective data memory unit within the data memory, a replacement data memory unit within the redundancy data memory is accessed. In order to test whether the address diversion within the redundancy logic has been ended successfully, in a subsequent further test step, by comparing test data patterns a check is made to determine whether the memory is now functional.

In the event of a memory access to the data memory, firstly an address comparison is effected in the redundancy logic and afterward, provided that the addressed data memory unit is not defective, the addressed data memory unit within the data memory is accessed or, if the addressed data memory unit is identified as a defective data memory unit, a replacement data memory unit within the redundant memory is accessed.

One disadvantage of the arrangement according to the prior art as illustrated in FIG. 1 is that the redundant memory is integrated into the original data memory. In the case of a prescribed data memory with a predetermined size, for example a RAM memory with a memory space of one megabyte, the data memory must be correspondingly adapted in circuitry for the integration of a redundant memory space.

The memory illustrated in FIG. 1 furthermore has the serious disadvantage that the memory access to a data memory unit takes a relatively long time. The memory access time $T_{access}$ to a data memory unit within the memory illustrated in FIG. 1 is the sum of the address comparison time $T_V$, required for the address comparison within the redundancy logic, and the access time to the data memory $T_{ZD}$.

$$T_{access} = T_{ZD} + T_V$$

SUMMARY OF THE INVENTION

The object of the present invention is to provide a data memory with redundant memory which has the shortest possible memory access time.

This object is achieved according to the invention by means of a data memory in the features specified in patent claim 1.

The invention provides a data memory having a main data memory comprising a multiplicity of data memory units, a redundancy data memory, which comprises a plurality of redundancy data memory units for the replacement of defective data memory units of the main data memory, and having a redundancy control logic for controlling the access to the redundancy data memory, the main data memory and the redundancy data memory being connected to a data bus in parallel with one another via data lines, and the main data memory and the redundancy control logic being connected, in parallel with one another, via address lines, to an address bus for the addressing of data memory units in the data memory.

One advantage of the data memory according to the invention is that it is provided with a redundant memory without the main data memory having to be adapted in circuitry.

A further advantage of the data memory having the features specified in patent claim 1 is the expedient nature of its testing, since the redundancy data memory can immediately be concomitantly tested when a test pattern is applied for checking the functionality of the data memory.

In a preferred embodiment of the data memory, the redundancy control logic has an address memory with a plurality of address memory units, which store addresses of defective data memory units of the main data memory.

In one embodiment of the data memory, the address memory units are associative memory units CAM connected to the address bus, the associative memory units being provided for enabling associated redundancy data memory units of the redundancy data memory.

In a further embodiment, the address memory units are address memory registers.

In this case, the address memory registers preferably each have a flag bit which indicates whether the content of the address memory register is valid.

The redundancy control logic preferably has a plurality of comparators which are in each case connected to an address memory register and the address bus and enable an associated redundancy data memory unit of the redundancy data memory if the address present in the address bus corresponds to the address stored in the address memory register.

The redundancy control logic preferably controls a first multiplexer for reading data from the main data memory or the redundancy data memory.

In a further preferred embodiment, the main data memory, the redundancy data memory and the redundancy control logic are connected, in parallel with one another, to a control bus for controlling the read or write access to the data memory.

In a particularly preferred embodiment of the data memory according to the invention, the address memory is connected to a programmed, non-erasable address read-only memory for permanently storing addresses of defective data memory units of the main data memory.

The redundancy control logic preferably controls a second multiplexer, which is connected, on the input side, to the redundancy data memory units of the redundancy memory and serves for reading data from one of the redundancy data memory units.

In this case, the redundancy data memory units of the redundancy memory are preferably data registers.

In a preferred embodiment, the main data memory is a RAM data memory.

In a further preferred embodiment, the main data memory is an SRAM data memory.

An address of a defective data memory unit of the main data memory can preferably be read out in an address memory unit of the address memory from a memory test logic integrated in the data memory, from an automatic test device or from the address read-only memory, and be written to the address memory unit.

Preferred embodiments of the data memory according to the invention are described below in order to elucidate features essential to the invention, with reference to the accompanying figures.

BRIEF DESCRIPTION OF THE DRAWINGS

FIG. 5 shows a flow diagram illustrating the testing and the address reprogramming in the case of the data memory according to the invention.

DETAILED DESCRIPTION OF EXEMPLARY EMBODIMENTS

Figure 2:
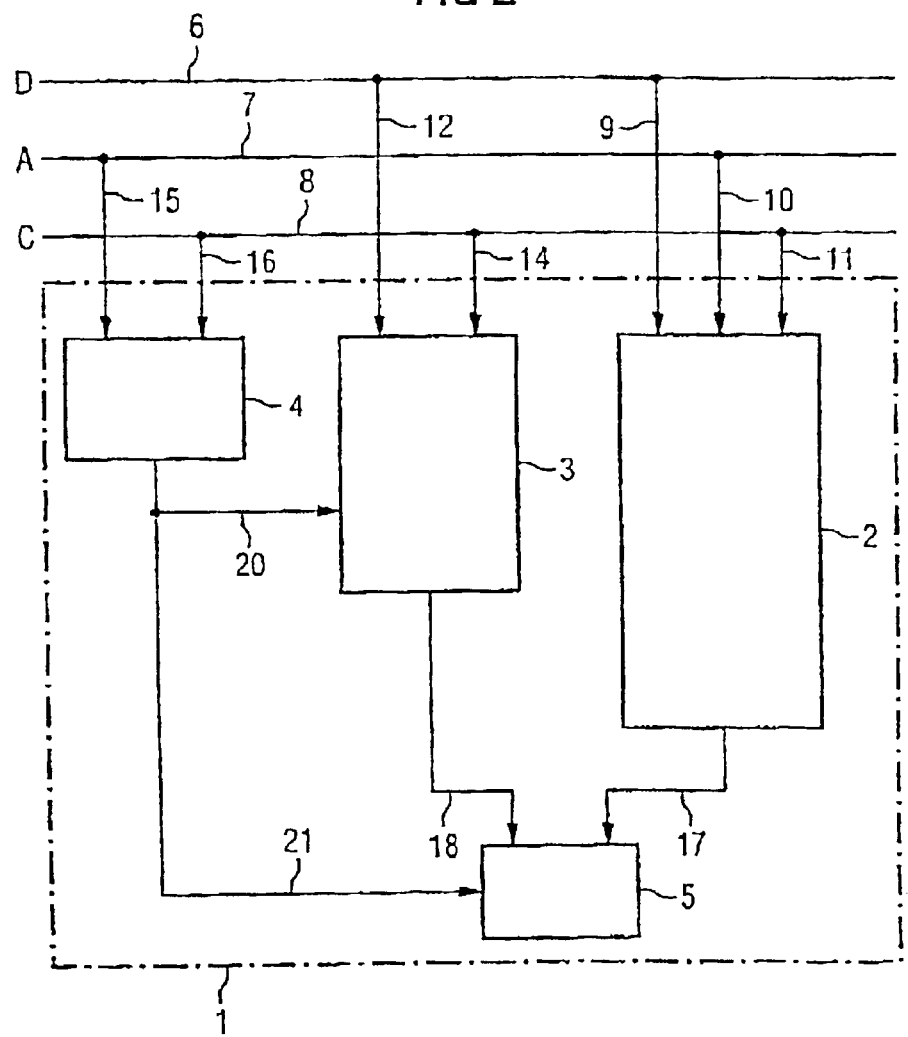
FIG. 2 shows a block diagram of the data memory according to the invention with a redundancy data memory.

FIG. 2 shows a block diagram of the data memory 1 according to the invention. The data memory 1 has a main data memory 2, a redundancy data memory 3, a redundancy control logic 4 and a data read-out multiplexer 5. The main data memory 2 is preferably a RAM memory, in particular a SRAM memory. The data memory 1 is connected to a data bus 6, an address bus 7 and to a control bus 8. In this case, the main data memory 2 is connected to the data bus 6 via data lines 9, to the address bus 7 via address lines 10 and to the control bus 8 via control lines 11. The redundancy data memory 3 is connected to the data bus 6 via data lines 12, to the address bus 7 via address lines 13 and to the control bus 8 via control lines 14. The redundancy control logic 4 is connected to the address bus 7 via address lines 15 and to the control bus 8 via control lines 16.

The main data memory 2 is connected to a first input of the data read-out multiplexer 5 via data read-out lines 17 and the redundancy data memory 3 is connected to a second input of the data read-out multiplexer 5 via data read-out lines 18. The data read-out multiplexer 5 can be connected, on the output side, via data lines 19, to the data bus 6 or a further data bus.

The redundancy control logic 4 controls the writing of data to the redundancy data memory 3 via a control line 20 and the changeover of the data read-out multiplexer 5 between the data read-out lines 17, 18 via a control line 21.

The main data memory 2 comprises a multiplicity of data memory units. The data memory units may be individual data bits, data words, data columns, data rows, data arrays or data macro areas. The data memory units can be addressed by means of a dedicated individual address.

The redundant data memory 3 has a plurality of redundancy data memory units for the replacement of defective data memory units within the main data memory 2. In this case, the number of redundancy data memory units is considerably smaller than the number of data memory units within the main data memory 2. If, in the fabrication process of the data memory 1, defective data memory units are fabricated within the main data memory 2, the redundancy data memory units within the redundancy data memory 3 take over their memory functions. The redundant control logic 4 controls the access to the redundancy data memory 3 if an access to a defective data memory unit of the main data memory 2 is ascertained.

The main data memory 2 and the redundancy data memory 3 are connected to the data bus 6 in parallel with one another via the data write lines 10, 12. On the output side, the main data memory 2 and the redundancy data memory 3 are connected to the data bus 6 likewise in parallel via the data read-out multiplexer 5 and the data read-out lines 19.

The main data memory 2 and the redundancy control logic 4 are connected, in parallel with one another, via the address lines 10, 15, to the address bus 7 for addressing data memory units in the data memory 1.

Figure 3:
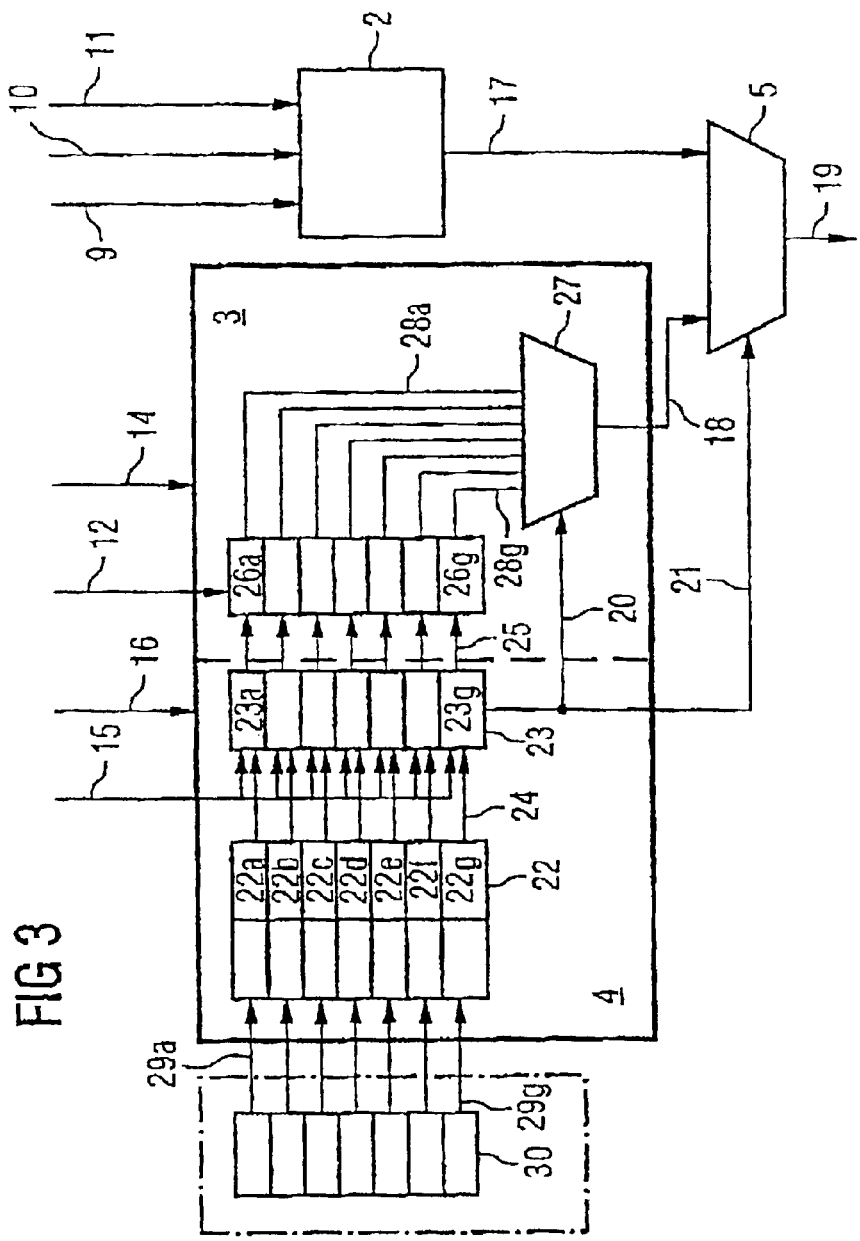
FIG. 3 shows a first embodiment of the data memory according to the invention.

In the embodiment shown in FIG. 3, the redundancy data memory 3 and the redundancy control logic 4 are integrated in one component, thereby facilitating the electrical connection to an already existing main data memory 2.

The redundancy control logic 4 contains an address memory 22 with a plurality of address memory units 22a to 22g, in which addresses of defective data memory units within the main data memory 2 can be stored. The address memory units 22a to 22g are address memory registers. In this case, each address memory register 22a to 22g preferably has a flag bit which indicates whether the content of the address memory register is valid.

The redundancy control logic 4 furthermore contains an address comparison circuit 23 with a plurality of address comparators 23a to 23g, which are in each case connected to an address memory register 22a to 22g via internal address lines 24a to 24g and to the address bus 7 via address lines 15. The comparators 23a to 23g in each case have address bit comparison circuits for comparing the address bit levels present on the address lines 15 and the internal address lines 24. After a memory test has been effected, the addresses of defective data memory units within the main data memory 2 are written to the address registers 22a to 22g.

If the address present on the address lines 15 is identical to an address register stored in an address register 22a to 22g, this is identified in the address comparison circuit and, via control lines 25a to 25g, an associated redundancy data memory unit 26a to 26g of the redundancy data memory 3 is activated and the corresponding redundancy data memory unit 26a to 26g is connected to the data read-out multiplexer 5 via an internal data read-out multiplexer 27 of the redundancy data memory 3. The redundancy data memory units 26a to 26g of the redundancy data memory 3 are connected to the internal multiplexer 27 of the redundancy data memory 3 via internal data lines 28a to 28g.

If, by way of example, the address present on the address lines 15 corresponds to the address stored in the address memory register 22a, this is identified by the comparator 23a of the address comparison circuit 23 and the redundancy data memory unit 26a of the redundancy data memory 3 is activated via the control line 25a. The address comparison circuit 23 switches the multiplexer 27 via the control line 22 in such a way that the internal line 28a is connected through to the output line 18 of the multiplexer 27. At the same time, the address comparison circuit 23 controls the multiplexer 5 in such a way that the latter connects the data line 18 to the data line 19, so that the data contained in the redundancy data memory unit 26a are output via the data lines 19 to the data bus 6.

Conversely, if no address for the addressing of a defective data memory unit within the main data memory 2 is present on the address bus 7, the corresponding data memory unit is addressed via the address lines 10 and its content is output via the data read-out lines 17 and the data read-out lines 19 to the data bus 6. For this purpose, the multiplexer 5 is switched in such a way that the data lines 17 are directly connected to the data lines 19.

The data access to a data memory unit within the main data memory 2 is effected very rapidly in this case since the address comparison within the redundancy control logic 4 is effected temporally in parallel. The redundancy data memory 3 has a much shorter access time than the main data memory 2. While the main data memory 2 is provided with a multiplicity of data memory units, the redundancy data memory 3 has only a few redundancy data memory registers 26a to 26g for the replacement of defective data memory units within the main data memory 2. The time $T_V$ required by the address comparison circuit 23 for the address comparison is also relatively short, so that the sum of the address comparison time $T_V$ and the memory access time to the redundancy data memory 3 $T_{ZR}$ is less than the access time $T_{ZH}$ to the main data memory 2.

$$T_V + T_{ZR} < T_{ZH}$$

Consequently, the memory access time to the data memory 1 according to the invention, in the event of an access to a non-defective data memory unit of the main data memory 2, turns out to be:

$$T_Z = T_{ZH} + T_{MUX}$$

where $T_{MUX}$ is the switching time of the multiplexer 5.

The switching time of the multiplexer 5 $T_{MUX}$ is very small. It is far smaller than the address comparison time of the address comparison circuit 23.

$$T_{MUX} << T_V$$

Figure 1:
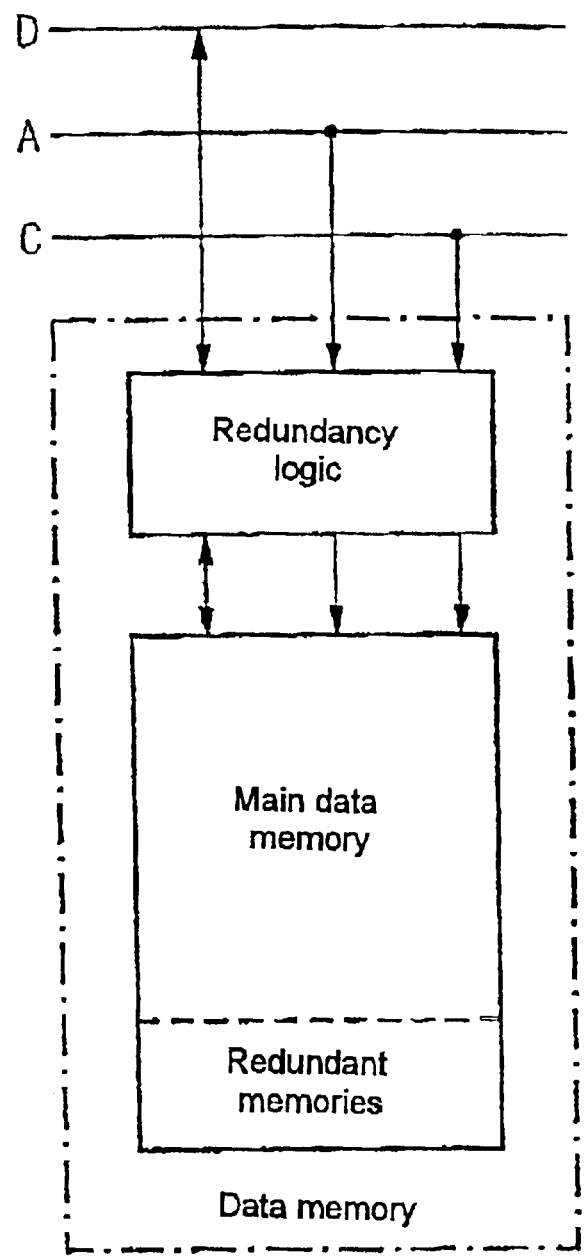
FIG. 1 shows a data memory with redundant memory according to the prior art.

As can be discerned by comparing the construction of the data memory according to the invention with the circuitry construction according to the prior art as shown in FIG. 1, the memory access time $T_Z$ is far higher in the conventional arrangement than in the data memory 1 according to the invention.

In the conventional data memory, the memory access time $T_Z$ is:

$$T_Z = T_V + T_{ZH}$$

where $T_V$ is the address comparison time required by the redundancy logic in order to ascertain whether a defective address is present on the address bus A, and $T_{ZH}$ represents the memory access time to the main data memory.

By contrast, the maximum memory access time $T_Z$ of the data memory 1 according to the invention is:

$$T_Z = T_{MUX} + T_{ZH} \text{ if } T_V + T_{ZR} < T_{ZH}$$

where $T_{MUX}$ is the switching time of the multiplexer 5 and $T_{ZH}$ represents the memory access time to the main data memory 2.

This time advantage is obtained by virtue of the fact that, during the memory access time $T_{ZH}$ to data memory units within the main data memory 2, the address comparison within the redundancy control logic 4 already takes place simultaneously in parallel and, after the end of the memory access to the main data memory 2, a changeover is effected by the multiplexer 5 only in dependence on the comparison result between the redundancy data memory 3 and the main data memory 2.

As can be discerned in FIG. 3, the main data memory 2, the redundancy data memory 3 and the redundancy control logic 4 are connected, in parallel with one another, via control lines 11, 14, 16, to the control bus 8 for controlling a read or write access to the data memory 1. The writing process to the redundancy data memory 3 is effected in two steps. In the event of a rising clock edge, the input addresses and the input data are stored in a buffer. The comparators 23a to 23g compare the input address with the contents of the address memory registers 22a to 22g. If one of the stored addresses corresponds to the input address, the buffer-stored input data are written to the corresponding data memory register 26a to 26g upon the next clock edge.

In the preferred embodiment shown in FIG. 3, the address memory 22 is connected via address read-in lines 29a to 29g to an address read-only memory 30 for permanently storing addresses of defective data memory units of the main data memory 2.

The addresses identified as defective after the testing of the data memory 1 are fixedly programmed in the address read-only memory 30. The address read-only memory 30 is preferably a nonvolatile memory. The address read-only memory 30 preferably comprises fuses which are blown after the test process in accordance with the addresses identified as defective.

The address memory 22 preferably contains a plurality of address memory registers 22a to 22g which each have a flag bit which indicates whether the content of the address register 22a to 22g is valid. If, after testing, it is identified that the main data memory 2 contains no defective data memory units, the redundancy control logic 4 is deactivated by all the flag bits remaining reset.

Figure 4:
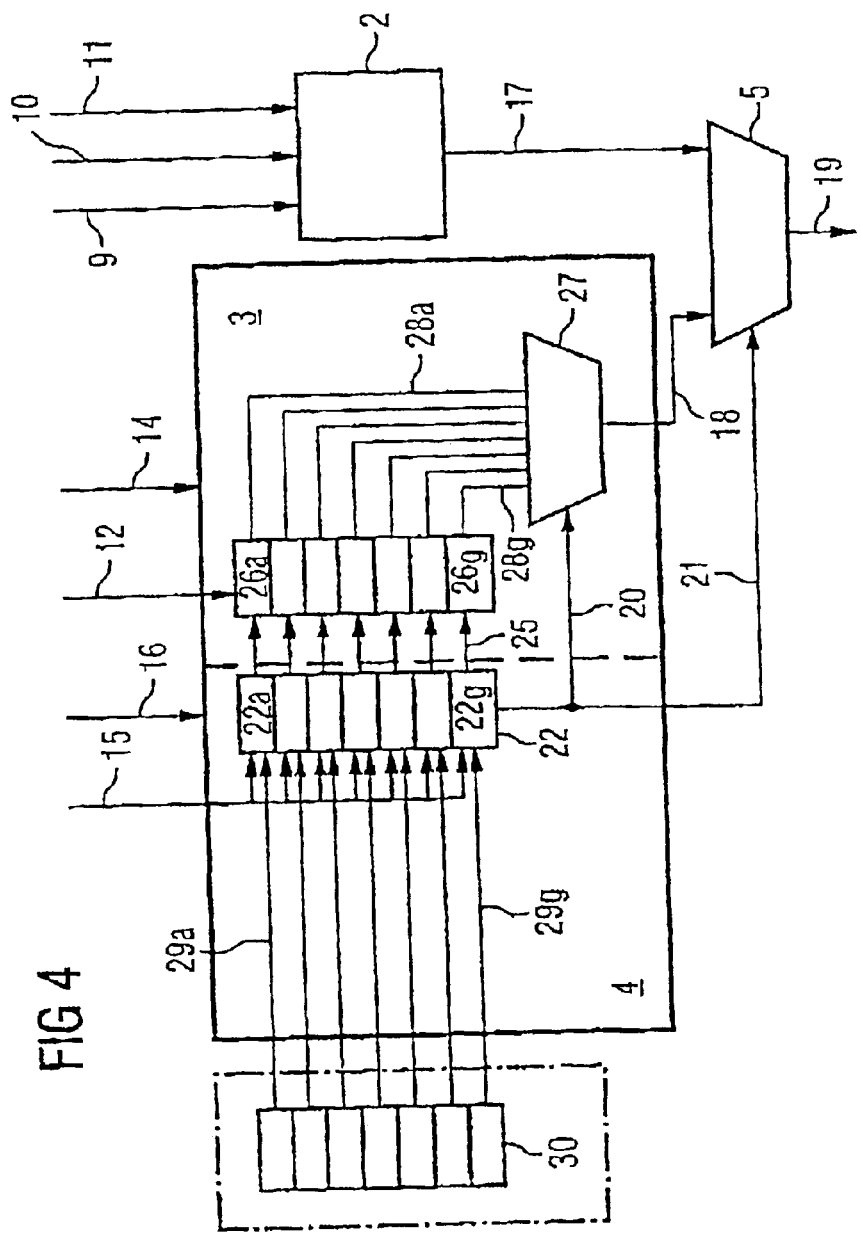
FIG. 4 shows a second embodiment of the data memory according to the invention.

FIG. 4 shows an alternative embodiment of the redundancy control logic 4, in which the address memory units 22a to 22g of the address memory 22 are in this case associative memory units connected to the address bus 7, for enabling the associated redundancy data memory units 26a to 26g of the redundancy data memory 3.

FIG. 5 shows a flow diagram for illustrating the programming operation of the data memory according to the invention with addresses of defective data memory units.

In a step $S_0$, a memory test is started. Afterward, the step $S_1$ of initialization of arrays and address memory registers is carried out. In a step $S_2$, an address is applied to the address bus 7 and a test datum is applied to the data bus 6. In step $S_3$, evaluation is effected to determine whether the output data value present on the data bus 6 corresponds to an expected data output value. If this is the case, in step $S_4$ a decision is made as to whether the test is ended. If the test pass of the main data memory 2 has not yet been ended, in step $S_5$ the next address is generated and, in step $S_2$, is applied to the address bus 7 again. The loop comprising the steps $S_2$, $S_3$, $S_4$, $S_5$ is iterated for all the addresses of the main data memory 2.

If it is ascertained in step $S_3$ that the output data value does not correspond to the expected test data value, it is identified that the corresponding data memory unit within the main data memory 2 is defective. In a step $S_6$, a check is made to determine whether there are still any free address memory registers or associative memories 22a to 22g within the redundancy control logic 4. If the address memory 22 of the redundancy control logic 4 is already filled with addresses of defective data memory units and, consequently, there are no further address memory units available within the redundancy control logic 4, the data memory 1 fabricated defectively in this way can no longer be repaired since too many fabrication defects have occurred and the sequence illustrated in FIG. 5 outputs, in step $S_7$, an indication signal which indicates that a repair of the data memory 1 cannot be carried out.

If it is ascertained in step $S_6$ that there is still a free address memory unit 22a to 22g within the redundancy control logic 4, in step $S_8$ the address identified as defective is written to the address memory unit of the address memory 22 and, if appropriate, a flag bit that is present is set.

In step $S_8$, the test data to be applied are reset and the test is begun anew.

The addresses of the data memory units identified as defective within the main data memory 2 are written to address memory units 22a to 22g of the address memory 22 within the redundancy control logic 4. In this case, the addresses identified as defective may originate from a built-in memory test logic BIST integrated in the data memory 1, an automatic test device TA or from the address read-only memory 30. The memory access time from the data memory 1 is considerably shortened through the parallel arrangement of the redundancy data memory 3 and of the main data memory 2 with regard to the data bus 6 and also through the parallel arrangement of the redundancy control logic 4 and of the main data memory 2 with regard to the address bus 7.

The redundancy control logic 4 and the redundancy data memory 3 can be constructed in an integrated manner as one electronic component. As a result of this, an existing main data memory 2 can be provided with a redundant memory space in a simple manner through connection to such an integrated component via a multiplexer 5.

In a further preferred embodiment, the multiplexer 5 is integrated with the redundancy control logic 4 and the redundancy data memory 3 and the address read-only memory 30 in one electronic circuit. For expansion of an existing main data memory 2, such an integrated component merely has to be connected to the data bus 6, the address bus 7, the control bus 8 and, via the line 17, to the main data memory 2.

What is claimed is:

1. A data memory, comprising:
a main data memory having a plurality of data memory units;
a redundancy data memory comprising a plurality of redundancy data memory units to replace defective data memory units of the main data memory and a redundancy control logic for controlling access to the redundancy data memory, wherein the main data memory and the redundancy data memory are connected to a data bus in parallel with one another via data lines, and wherein the main data memory and the redundancy control logic are connected, in parallel with one another, via address lines, to an address bus for the addressing of data memory units in the data memory.

2. Data memory according to claim 1, wherein the redundancy control logic has an address memory with a plurality of address memory units, which store addresses of the defective data memory units of the main data memory.

3. Data memory according to claim 2, wherein the plurality of address memory units are associative memory units connected to the address bus.

4. Data memory according to claim 2, wherein the plurality of address memory units are address memory registers.

5. Data memory according to claim 4, wherein each of the address memory registers has a flag bit which indicates whether the content of each of the address memory registers is valid.

6. Data memory according to claim 4, wherein the redundancy control logic has a plurality of comparators, which each are connected to an address memory register and the address bus, and which enable an associated redundancy data memory unit of the redundancy data memory if the address present on the address bus corresponds to the address stored in the address memory register.

7. Data memory according to claim 1, wherein the redundancy control logic controls a first multiplexer for reading data from the main data memory or the redundancy data memory.

8. Data memory according to claim 1, wherein the main data memory, the redundancy data memory and the redundancy control logic are connected, in parallel with one another, to a control bus for controlling a read or write access to the data memory.

9. Data memory according to claim 1, wherein the address memory is connected to a programmable nonvolatile address read-only memory for permanently storing addresses of the defective data memory units of the main data memory.

10. Data memory according to claim 1, wherein the redundancy control logic drives a second multiplexer, which is connected, on an input side, to the redundancy data memory units of the redundancy memory.

11. Data memory according to claim 1, wherein the plurality of the redundancy data memory units of the redundancy data memory are registers.

12. Data memory according to claim 1, wherein the main data memory is a RAM memory.

13. Data memory according to claim 1, wherein the main data memory is an SRAM memory.

14. Data memory according to claim 1, wherein the address of a defective data memory unit of the main data memory is read into an address memory unit of the address memory from a memory test logic integrated into the data memory, from an automatic test device connected to the data memory or from the address read-only memory and is written to the address memory units.

* * * * *